United States Patent
Ha et al.

(10) Patent No.: US 11,609,604 B2
(45) Date of Patent: Mar. 21, 2023

(54) METHOD FOR MANUFACTURING DISPLAY MODULE

(71) Applicant: Samsung Display Co., Ltd., Yongin-si (KR)

(72) Inventors: SeungHwa Ha, Hwaseong-si (KR); Kyungmin Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 373 days.

(21) Appl. No.: 16/836,667

(22) Filed: Mar. 31, 2020

(65) Prior Publication Data
US 2020/0371552 A1    Nov. 26, 2020

(30) Foreign Application Priority Data

May 22, 2019  (KR) .................. 10-2019-0059929

(51) Int. Cl.
*G06F 1/16* (2006.01)
*G06F 1/20* (2006.01)
*G09F 9/30* (2006.01)
*H01L 51/56* (2006.01)

(52) U.S. Cl.
CPC .......... *G06F 1/1616* (2013.01); *G06F 1/1637* (2013.01); *G06F 1/203* (2013.01); *G06F 1/206* (2013.01); *G09F 9/301* (2013.01); *H01L 51/56* (2013.01)

(58) Field of Classification Search
CPC ...... G06F 1/1616; G06F 1/1637; G06F 1/203; G06F 1/206; G06F 1/1652; G06F 1/1641; H01L 51/56; H01L 51/0026; H01L 51/5281; H01L 2251/5338; H01L 51/0097; G09F 9/301; Y02P 70/50; Y02E 10/549
See application file for complete search history.

(56) References Cited

U.S. PATENT DOCUMENTS

| | | | | |
|---|---|---|---|---|
| 2011/0310312 A1* | 12/2011 | Yokote | ...................... | G06F 1/20 348/836 |
| 2018/0164854 A1* | 6/2018 | Wood | .................... | G06F 1/1681 |
| 2020/0245501 A1* | 7/2020 | Wu | .................... | H05K 7/20963 |

FOREIGN PATENT DOCUMENTS

| | | |
|---|---|---|
| KR | 10-2011-0052759 | 5/2011 |
| KR | 10-2014-0080238 | 6/2014 |
| KR | 10-2017-0061804 | 6/2017 |
| KR | 10-2017-0070917 | 6/2017 |

* cited by examiner

*Primary Examiner* — Kevin Quarterman
(74) *Attorney, Agent, or Firm* — H.C. Park & Associates, PLC

(57) ABSTRACT

A method for manufacturing a display module that is variable from a first state, which is unfolded, to a second state, which is folded with respect to a folding axis, may include folding the display module into a third state that is different from the second state, and performing a first heat treatment on the display module in the third state at a first temperature.

18 Claims, 10 Drawing Sheets

METHOD FOR MANUFACTURING DISPLAY MODULE

CROSS REFERENCE TO RELATED APPLICATION

This application claims priority from and the benefit of Korean Patent Application No. 10-2019-0059929, filed on May 22, 2019, which is hereby incorporated by reference for all purposes as if fully set forth herein.

BACKGROUND

Field

Exemplary embodiments of the present application relate to a method for manufacturing a display module having improved reliability.

Discussion of the Background

A display device displays various images on a display screen to provide information to a user. In general, the display device displays the information within an assigned screen. In recent years, flexible display devices, including a foldable flexible display panel, have been developed. The flexible display device may be folded, rolled, or bent, unlike a rigid display device. The flexible display device having a variously changeable shape may be portably transported regardless of an original screen size to thus improve convenience of a user.

The above information disclosed in this Background section is only for understanding of the background of the inventive concepts, and, therefore, it may contain information that does not constitute prior art.

SUMMARY

Exemplary embodiments of the present invention provide a method for manufacturing a display module having improved reliability.

Additional features of the inventive concepts will be set forth in the description which follows, and in part will be apparent from the description, or may be learned by practice of the inventive concepts.

An exemplary embodiment of the present invention provides a method for manufacturing a display module that is variable from a first state, which is unfolded, to a second state, which is folded with respect to a folding axis, the method including: folding the display module into a third state that is different from the second state; and performing a first heat treatment on the display module in the third state at a first temperature.

The first temperature may be equal to or greater than about 50° C. and equal to or less than about 100° C.

The first heat treatment is performed for a time period equal to or greater than about 30 minutes and equal to or less than about 60 minutes.

The method may further include cooling the display module at a second temperature.

The second temperature may be equal to or less than about −20° C.

The cooling of the display module at the second temperature may be performed for a time period equal to or greater than about 10 minutes and equal to or less than about 15 minutes.

The method may further include performing second heat treatment on the display module at a third temperature.

The third temperature may be equal to or greater than about 20° C. and equal to or less than about 50° C.

A folding area of the display module may have a first radius of curvature in the second state, the folding area of the display module may have a second radius of curvature in the third state, and the first radius of curvature may be equal to or greater than the second radius of curvature.

The method may further include fixing the display module, including: an arrangement process of providing the display module in the third state between a first fixing part and a second fixing part that is spaced apart from the first fixing part while facing the same; a first fixing process of fixing the first fixing part and the display module by using a first adhesive part; and a second fixing process of fixing the second fixing part and the display module by using a second adhesive part.

The display module may include a first display surface folded with respect to the folding axis, and a second display surface and a third display surface, which are spaced apart from each other with the first display surface therebetween, and each of the first adhesive part and the second adhesive part may be attached to the first display surface.

Each of the first fixing part and the second fixing part may be transparent.

The display module may include a first display surface folded with respect to the folding axis, and a second display surface and a third display surface, which are spaced apart from each other with the first display surface therebetween, such that, in the second state, the display module may be folded so that each of the second display surface and the third display surface faces the inside, and in the third state, the display module may be folded so that each of the second display surface and the third display surface faces the outside.

Another exemplary embodiment of the present invention provides a method for manufacturing a display device that is variable from a first state, which is unfolded, to a second state, which is folded with respect to a folding axis, including: forming a display module; and aging the display module that is folded into a third state different from the second state.

The aging of the display module may include: performing first heat treatment on the display module at a first temperature; and performing second heat treatment on the display module at a second temperature after the performing of the first heat treatment.

The first temperature may be equal to or greater than about 50° C. and equal to or less than about 100° C., and the second temperature may be equal to or greater than about 20° C. and equal to or less than about 50° C.

The first heat treatment may be performed for a time period equal to or greater than about 30 minutes and equal to or less than about 60 minutes.

The aging of the display module may further include cooling the display module at a temperature equal to or less than about −20° C. between the performing of the first heat treatment and the performing of the second heat treatment.

The display module may include a first display surface folded with respect to the folding axis, and a second display surface and a third display surface, which are spaced apart from each other with the first display surface therebetween, such that, in the second state, the display module may be folded so that each of the second display surface and the third display surface faces the inside, and in the third state, the display module may be folded so that each of the second display surface and the third display surface faces the outside.

A folding area of the display module may have a first radius of curvature in the second state, the folding area of the display module may have a second radius of curvature in the third state, and the first radius of curvature may be equal to or greater than the second radius of curvature.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
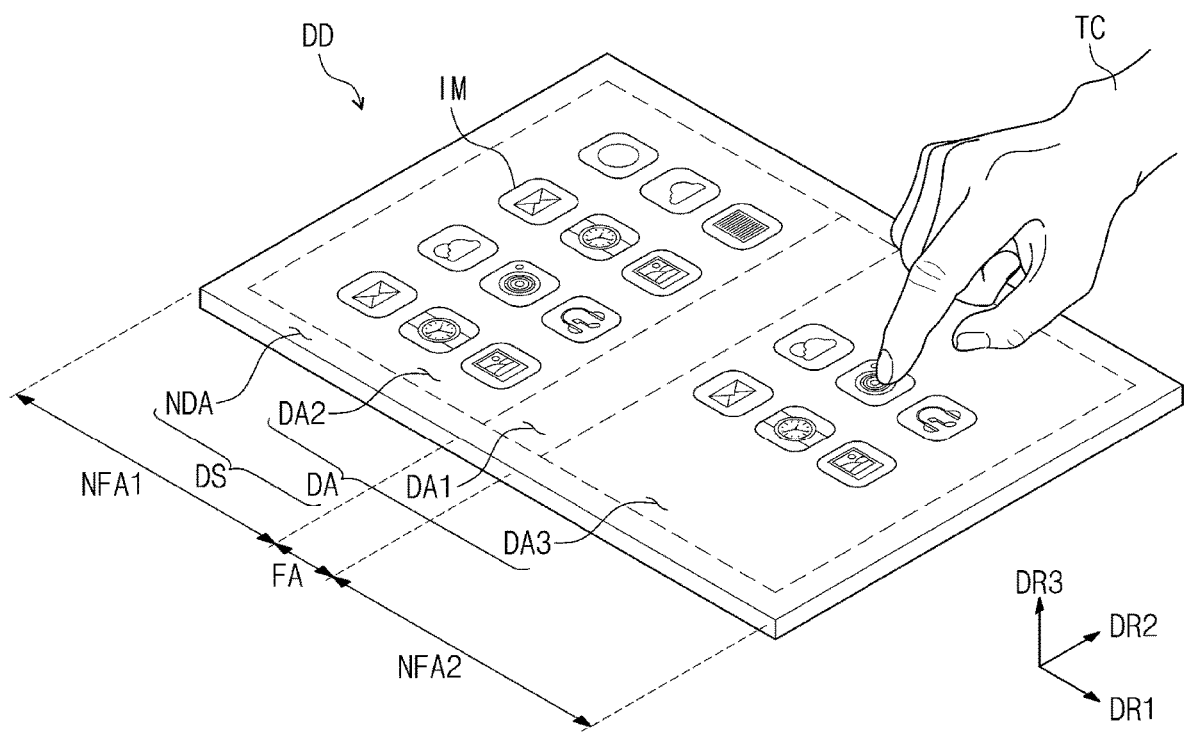
FIG. 1 is a perspective view illustrating a display device according to an exemplary embodiment of the inventive concepts.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalties between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath"

other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the inventive concepts will be described with reference to the accompanying drawings.

Figure 2A:
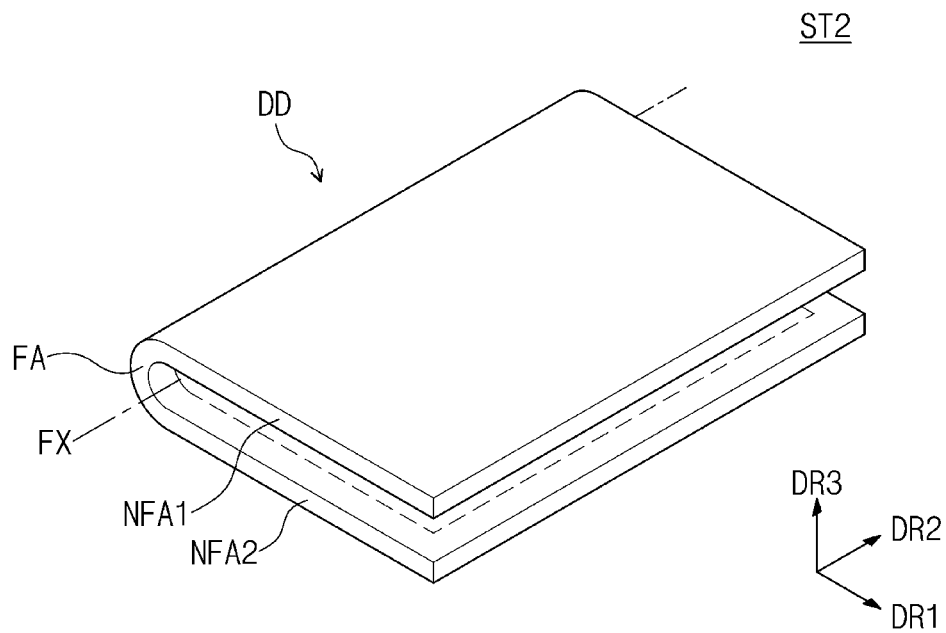
FIGS. 2A and 2B are views illustrating a folded state of the display device according to an exemplary embodiment of the inventive concepts.

FIG. 1 is a perspective view illustrating a display device according to an exemplary embodiment of the present invention, and FIG. 2A is a view illustrating a folded state of the display device according to an exemplary embodiment of the present invention.

Referring to FIGS. 1 and 2A, a display device DD may be a foldable display device. The display device DD according to an exemplary embodiment of the present invention may be used for large-sized display devices, such as televisions and monitors and small and medium-sized display devices, such as mobile phones, tablet computers, navigation units for vehicles, game consoles, and smart watches.

The display device DD may have a top surface that is defined as a display surface DS, and the display surface DS in an unfolded state may have a plane defined by a first direction DR1 and a second direction DR2. A normal direction of the display surface DS, i.e., a thickness direction of the display device DD, indicates a third direction DR3. The third direction DR3 may cross each of the first and second directions DR1 and DR2. The first direction DR1, the second direction DR2, and the third direction DR3 may be perpendicular to each other.

Here, directions indicated by the first to third directions DR1, DR2, and DR3 may be a relative concept, and converted with respect to each other. Hereinafter, first to third directions may be indicated by the first to third directions DR1, DR2, and DR3, and designated by the same reference numerals, respectively. Also, in this specification, a surface defined by the first direction DR1 and the second direction DR2 may be defined as a plane, and an expression of "viewed on the plane" may be defined by a feature of viewing in the third direction DR3.

The display device DD may display an image IM through the top surface. For example, the display surface DS may display the image in the third direction DR3.

The display device DD may detect an external input TC. The external input TC may be an input of a user. The input of the user may include various types of external inputs, such as a portion of a user's body, light, heat, a pen, or pressure. In FIG. 1, the external input TC is illustrated as a user's hand applied to the display surface DS. The external input TC may be provided in various types as exemplarily described above, and the external input TC applied to a side surface or a rear surface of the display device DD may be detected according to a structure of the display device DD. However, inventive concepts are not limited thereto.

The display surface DS may include a display area DA and a non-display area NDA around the display area DA. The display area DA is an area on which the image IM is displayed, and the non-display area NDA is an area on which the image IM is not displayed. The image IM may include a static image as well as a moving image. FIG. 1 illustrates an application icon as an example of the image IM.

The display area DA may include a first display surface DA1 folded with respect to a folding axis FX and a second display surface DA2 and a third display surface DA3, which are spaced apart from each other with the first display surface DA1 therebetween.

The display area DA may have a rectangular shape. The non-display area NDA may surround the display area DA. However, the inventive concepts are not limited thereto. For example, the shapes of the display area DA and the non-display area NDA may be relatively designed. An unfolded state of the display device DD that is not folded may be referred to as a first state ST1.

A first non-folding area NFA1, a folding area FA, and a second non-folding area NFA2 may be defined on the display device DD in the first direction DR1. That is, the folding area FA may be defined between the first non-folding area NFA1 and the second non-folding area NFA2. Although one folding area FA and the first and second non-folding areas NFA1 and NFA2 are illustrated in FIGS. 1 and 2, the inventive concepts are not limited to the number of each of the folding area FA, the first non-folding area NFA1, and the second non-folding area NFA2. For example, the display device DD may include a plurality of non-folding areas and folding areas disposed between the non-folding areas.

The first display surface DA1 may be disposed on the folding area FA. The second display surface DA2 may be disposed on the first non-folding area NFA1. The third display surface DA3 may be disposed on the second non-folding area NFA2.

The display device DD may be folded with respect to the folding axis FX. That is, the folding area FA may be bent with respect to the folding axis FX. The folding axis FX may extend in the second direction DR2.

When the display device DD is folded, the second display surface DA2 and the third display surface DA3 may face each other. Thus, the display surface DS may not be exposed to the outside in a folded state.

A folded state of the display device DD while the second display surface DA2 and the third display surface DA3 face each other may be referred to as a second state ST2. In the second state ST2, the display device DD may be folded so that the second display surface DA2 and the third display surface DA3 face the inside. The display device DD is variable from the first state ST1 to the second state ST2.

Figure 2B:
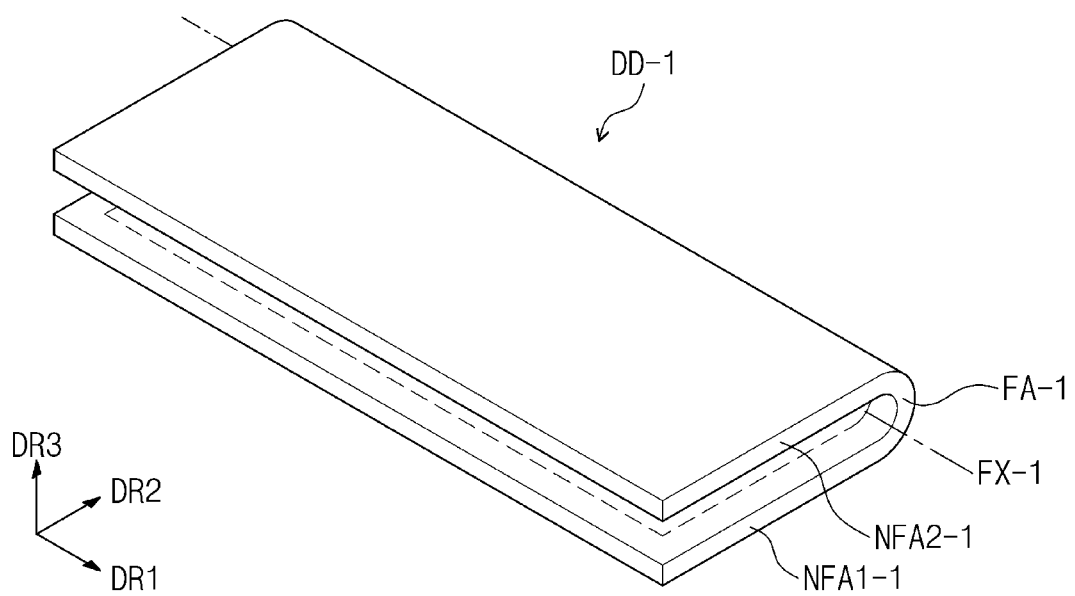

FIG. 2B is a view illustrating a folded state of a display device according to an exemplary embodiment of the present invention.

Referring to FIG. 2B, a display device DD-1 may be folded with respect to a folding axis FX-1. That is, a folding area FA-1 may be bent with respect to the folding axis FX-1. The folding axis FX-1 may extend in the first direction DR1. The folding axis FX-1 may be defined as a major axis that is parallel to a long side of the display device DD-1.

Hereinafter, although a structure of the display device DD folded with respect to a minor axis will be described, the inventive concepts are not limited thereto. For example, structures, which will be described below, may be applied to the display device DD-1 folded with respect to a major axis.

Figure 3:
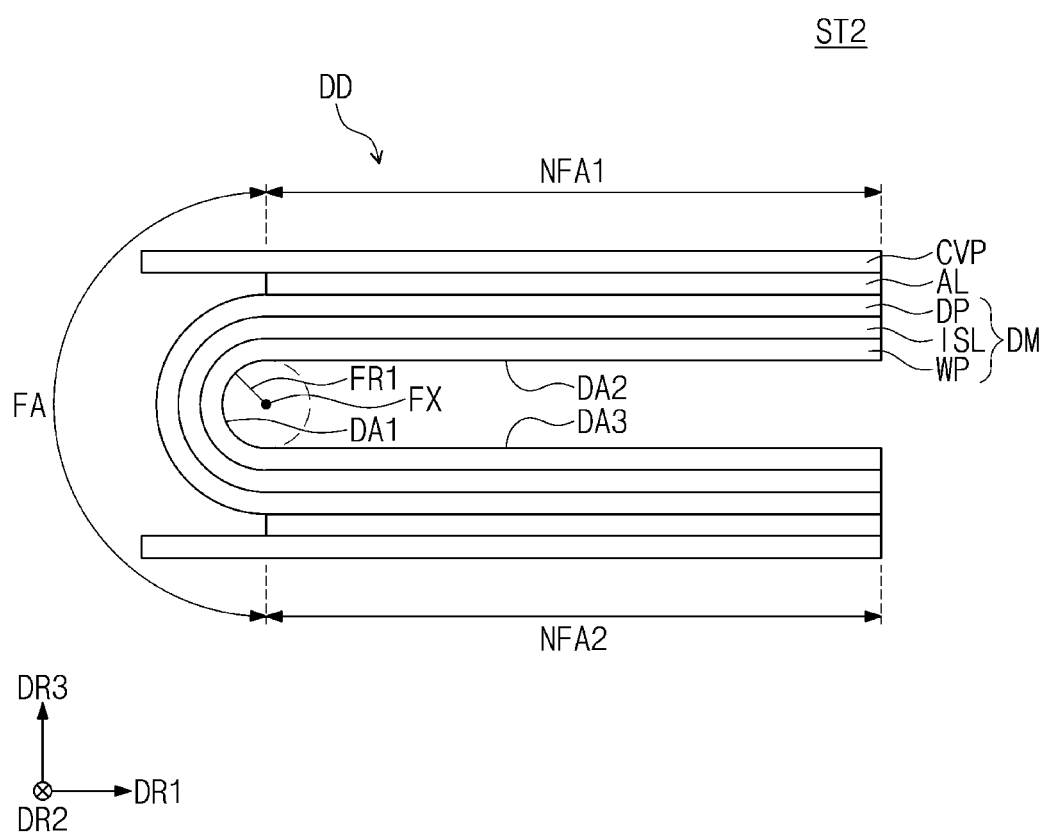
FIG. 3 is a cross-sectional view illustrating the display device according to an exemplary embodiment of the inventive concepts.

FIG. 3 is a cross-sectional view illustrating the display device according to an exemplary embodiment of the present invention.

Referring to FIG. 3, the display device DD may include a display module DM, an adhesive layer AL, and a cover member CVP.

The display module DM may include a window panel WP, an input detecting layer ISL, and a display panel DP.

The window panel WP may include a glass substrate, a sapphire substrate, plastic, and a film. A top surface of the window panel WP may correspond to the display surface DS (refer to FIG. 1).

The input detecting layer ISL may be disposed below the window panel WP. The input detecting layer ISL may detect an external input through the window panel WP.

The display panel DP may be disposed below the input detecting layer ISL. The display panel DP may display an image through the window panel WP. Although the display panel DP according to an exemplary embodiment of the present invention may be a light emitting type display panel, the inventive concepts are not particularly limited thereto. For example, the display panel DP may be an organic light emitting display panel or a quantum dot light emitting display panel. The organic light emitting display panel may include a light emitting layer containing an organic light emitting material. The quantum dot light emitting display panel may include a light emitting layer containing a quantum dot and a quantum rod. Hereinafter, the display panel DP will be described as an organic light emitting display panel.

The cover member CVP may be disposed below the display module DM. The cover member CVP may support a rear surface of the display module DM and protect the display module DM.

The adhesive layer AL may be disposed between the display module DM and the cover member CVP. The display module DM and the cover member CVP may be coupled to each other by the adhesive layer AL. The adhesive layer AL may include a typical adhesive or sticking agent. For example, the adhesive layer AL may include a pressure sensitive adhesive (PSA), an optical clear adhesive (OCA), or an optical clear resin (OCR).

When the display device DD is in the second state ST2, the folding area FA of the display device DD may have a first radius of curvature FR1.

FIGS. 4A to 4F are cross-sectional views illustrating display modules according to exemplary embodiments of the present invention. FIGS. 4A to 4F are illustrated in a simplified manner in order to explain a lamination relationship between functional panels and/or functional units of display modules. Although display modules in the first state ST1 (refer to FIG. 1) are illustrated in FIGS. 4A to 4F, each of the display modules in FIGS. 4A to 4F may be varied from the first state ST1 (refer to FIG. 1) to the second state ST2 (refer to FIG. 2).

The display module DM (refer to FIG. 3) according to an exemplary embodiment of the present invention may include a display panel, an input detecting unit, an anti-reflection unit, and a window unit. At least some of the display panel, the input detecting unit, the anti-reflection unit, and the window member may be provided through a continuous process or may be coupled to each other by using an adhesion member. The display module DM (refer to FIG. 3) may have a top surface, which is defined by a top surface US of a display module DM-1 in FIG. 4A, and a bottom surface, which is defined by a bottom surface BS of the display module DM-1 in FIG. 4A.

The display module DM (refer to FIG. 3) may be one of display modules DM-1, DM-2, DM-3, DM-4, DM-5, and DM-6 in FIGS. 4A to 4F.

In FIGS. 4A to 4F, an optical clear adhesive member OCA is exemplarily illustrated as an adhesive member. Hereinafter, the adhesive member may include a typical adhesive or sticking agent. For example, the adhesive member may be a pressure sensitive adhesive (PSA) or an optical clear resin (OCR). In an exemplary embodiment of the present invention, the anti-reflection unit and the window unit may be omitted or replaced by another component.

In FIGS. 4A to 4F, among the input detecting unit, the anti-reflection unit, and the window unit, a component provided with another component through a continuous process is expressed by a "layer". Among the input detecting unit, the anti-reflection unit, and the window unit, a component coupled with another component through an adhesive member is expressed by a "panel". Although the panel includes a base layer providing a base surface, e.g., a synthetic resin film, a composite film, or a glass substrate, the "layer" may not include the base layer. In other words, the units expressed by the "layer" may be disposed on a base surface provided by another unit.

The input detecting unit, the anti-reflection unit, and the window unit may be referred to as an input detecting panel ISP, an anti-reflection panel RPP, and a window panel WP or an input detecting layer ISL, an anti-reflection layer RPL, and a window layer WL according to whether a base layer exists or not.

Figure 4A:
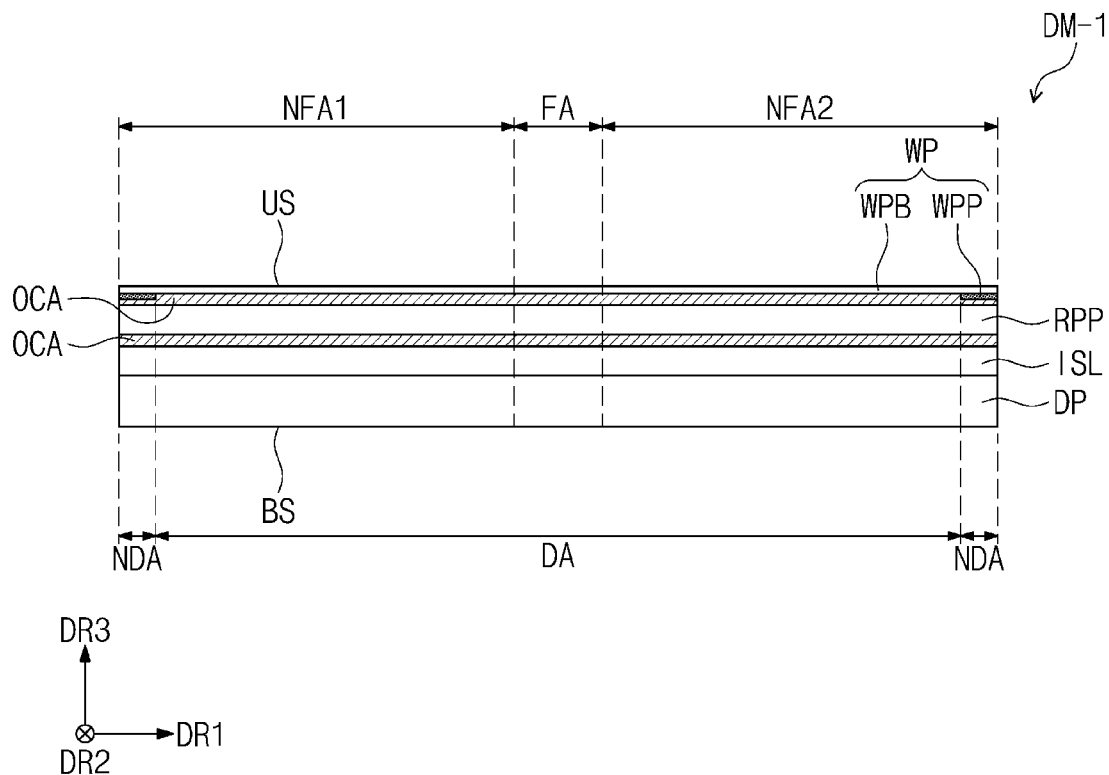
FIGS. 4A, 4B, 4C, 4D, 4E, and 4F are cross-sectional views illustrating display modules according to an exemplary embodiment of the inventive concepts.

As illustrated in FIG. 4A, the display module DM-1 may include a display panel DP, an input detecting layer ISL, an anti-reflection panel RPP, and a window panel WP. The input detecting layer ISL is disposed directly on the display panel DP. In this specification, an expression of "component B is directly disposed on component A" represents that an additional adhesive layer/adhesive member is not present between the component A and the component B. The B component is formed on a base surface provided by the component A through a continuous process after the component A is formed.

The optical clear adhesive member OCA is disposed between the input detecting layer ISL and the anti-reflection panel RPP and between the window panel WP and the anti-reflection panel RPP.

The input detecting layer ISL may include a plurality of insulation layers and a plurality of conductive layers. The plurality of conductive layers may include a detection electrode that detects an external input, a detection line connected to the detection electrode, and a detection pad connected to the detection line. However, the inventive concepts are not limited as to the method for detecting an external input.

The anti-reflection panel RPP decreases a reflectance of external light, which is incident from above the window panel WP. The anti-reflection panel RPP according to an exemplary embodiment of the present invention may include a retarder and a polarizer. The retarder may be a film type or a liquid crystal coating type and include a λ/2 retarder and/or a λ/4 retarder. The polarizer also may be a film type or a liquid crystal coating type. The film type may include a stretchable synthetic resin film, and the liquid crystal coating type may include liquid crystals oriented in a predetermined orientation. Each of the retarder and the polarizer may further include a protection film. The retarder and the polarizer themselves or the protection film may be defined as a base layer of the anti-reflection panel RPP.

The anti-reflection panel RPP according to an exemplary embodiment of the present invention may include color filters. The color filters may have a predetermined orientation. The orientation of the color filters may be determined in consideration of colors emitted from pixels contained in the display panel DP. The anti-reflection panel RPP may further include a black matrix adjacent to the color filters.

The anti-reflection panel RPP according to an exemplary embodiment of the present invention may include a destructive interference structure. For example, the destructive interference structure may include a first reflection layer and a second reflection layer, which are disposed on different layers from each other. First reflected light and second reflected light, which are reflected by the first reflection layer and the second reflection layer, respectively, may destructively interfere with each other, and thus, a reflectance of external light may decrease.

The window panel WP according to an exemplary embodiment of the present invention may include a base film WPB and a light shielding pattern WPP. The base film WPB may include a glass substrate and/or a synthetic resin film. Although the base film WPB has a single layer, the inventive concepts are not limited thereto. For example, the base film WPB may include two or more films that are coupled by an adhesive member.

The light shielding pattern WPP may partially overlap the base film WPB. The light shielding pattern WPP may be disposed on a rear surface of the base film WPB to define a bezel area, i.e., the non-display area NDA, of the display device DD.

The light shielding pattern WPP may be a colored organic layer and formed by, e.g., a coating method. Although not separately shown, the window panel WP may further include a functional coating layer disposed on a front surface of the base film WPB. The functional coating layer may include an anti-fingerprint layer, an anti-reflection layer, a hard coating layer, and the like. In FIGS. 4B to 4F, each of the window panel WP and the window layer WL is simply illustrated without being divided into the base film WPB and the light shielding pattern WPP.

Figure 4B:
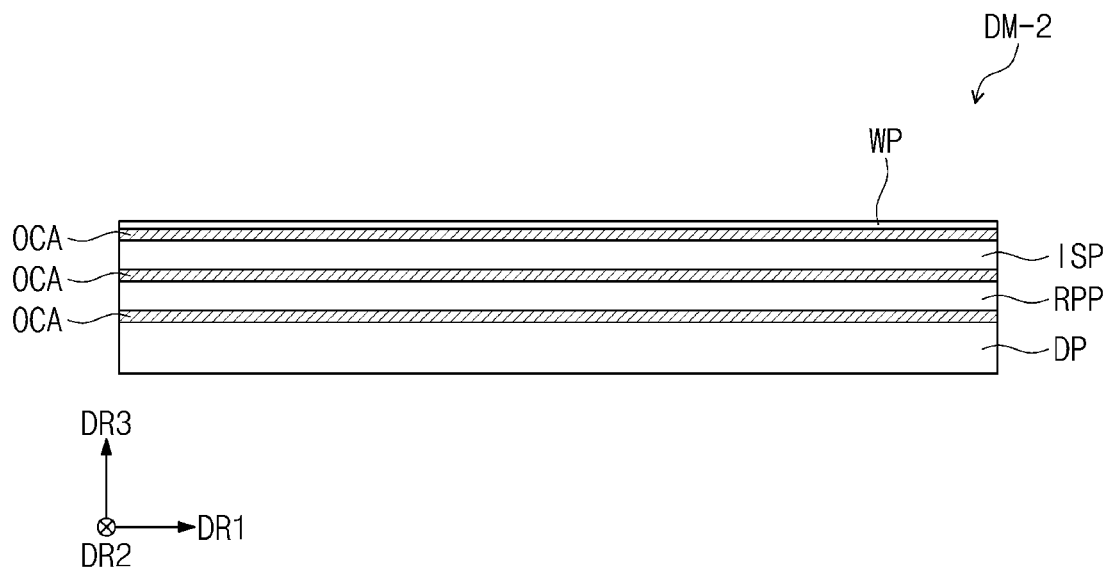
Figure 4C:
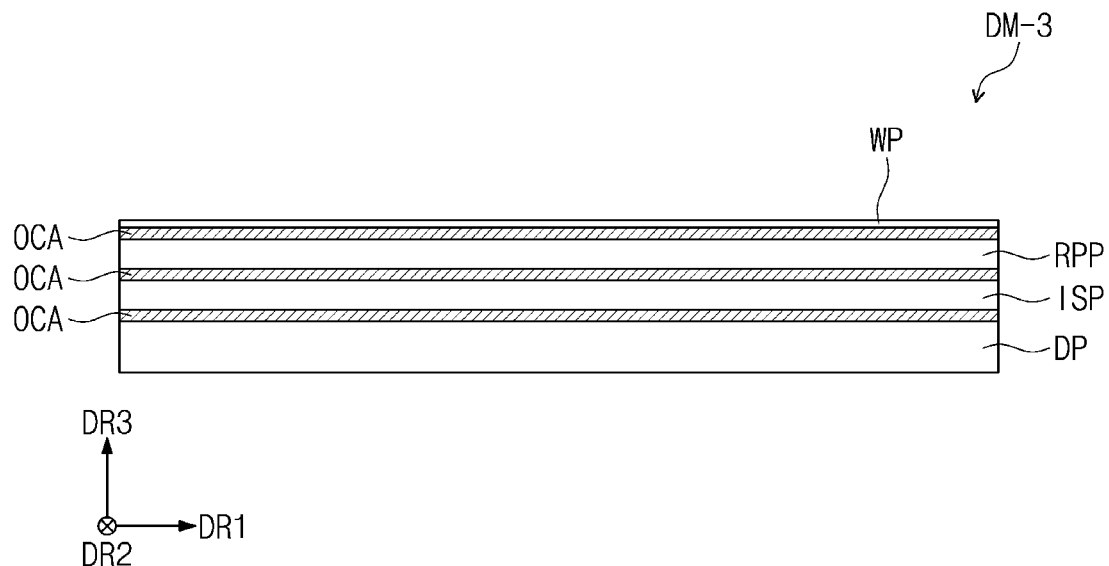

As illustrated in FIGS. 4B and 4C, each of the display modules DM-2 and DM-3 may include a display panel DP, an input detecting panel ISP, an anti-reflection panel RPP, and a window panel WP. A lamination order between the input detecting panel ISP and the anti-reflection panel RPP of the display module DM-2 may be different from that between the input detecting panel ISP and the anti-reflection panel RPP of the display module DM-3.

Figure 4D:
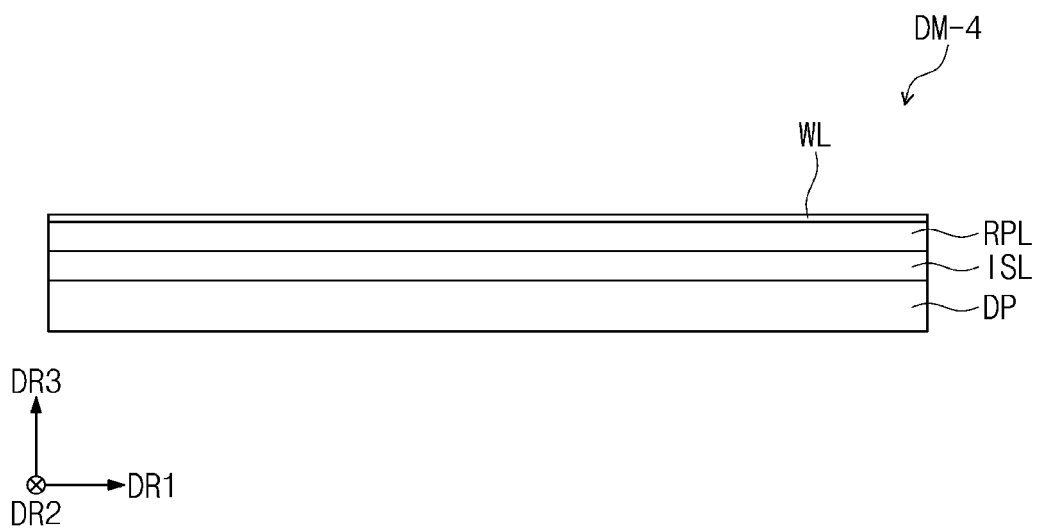

As illustrated in FIG. 4D, a display module DM-4 may include a display panel DP, an input detecting layer ISL, an anti-reflection layer RPL, and a window layer WL. On a base surface provided by the display panel DP, the input detecting layer ISL, the anti-reflection layer RPL, and the window layer WL may be formed through a continuous process. A lamination order between the input detecting layer ISL and the anti-reflection layer RPL may be changed.

Figure 4E:
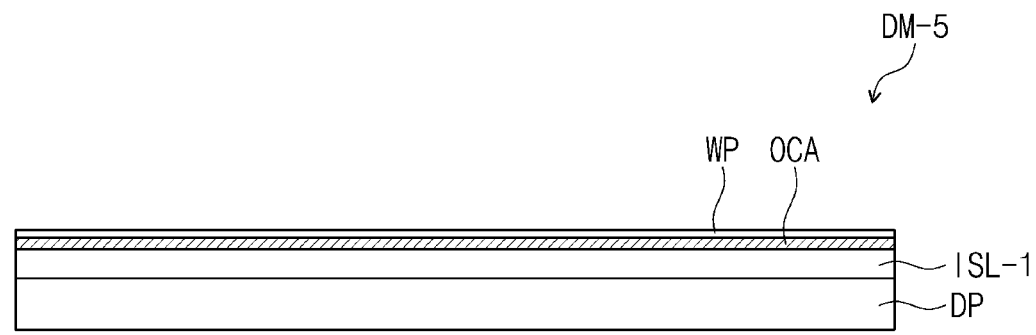
Figure 4E:
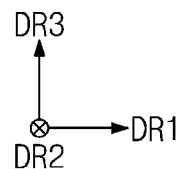
Figure 4F:
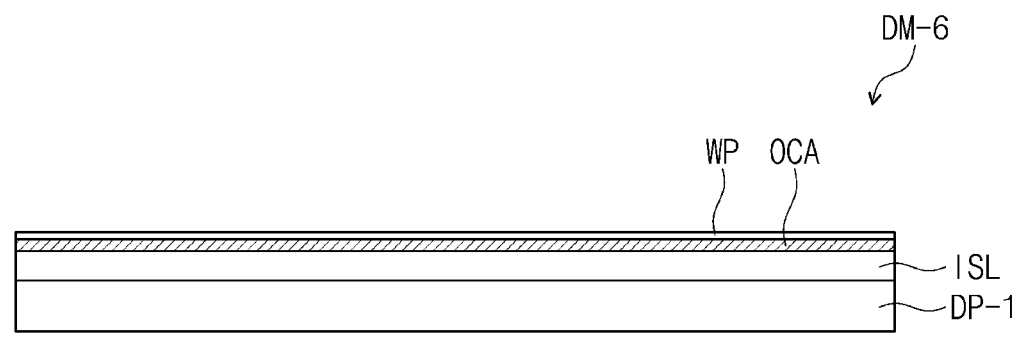
Figure 4F:
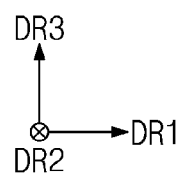

As illustrated in FIGS. 4E and 4F, each of the display modules DM-5 and DM-6 may not include a separate anti-reflection unit.

As illustrated in FIG. 4E, the display module DM-5 may include a display panel DP, an input detecting layer ISL-1, and a window panel WP. Unlike the input detecting panel ISP or the input detecting layer ISL in FIGS. 4A to 4D, an input detecting layer ISL-1 according to this exemplary embodiment may further have an anti-reflection function.

As illustrated in FIG. 4F, the display module DM-6 may include a display panel DP-1, an input detecting layer ISL, and a window panel WP. Unlike the display panel DP in FIGS. 4A to 4E, the display panel DP-1 according to this exemplary embodiment may further include an anti-reflection function.

For example, each of the input detecting layer ISL-1 and the display panel DP-1 may further include a functional layer having an anti-reflection function. Although the functional layer may be color filters having a predetermined orientation or a destructive interference structure having a lamination structure having different refractive indexes, the inventive concepts are not limited thereto.

Figure 5:
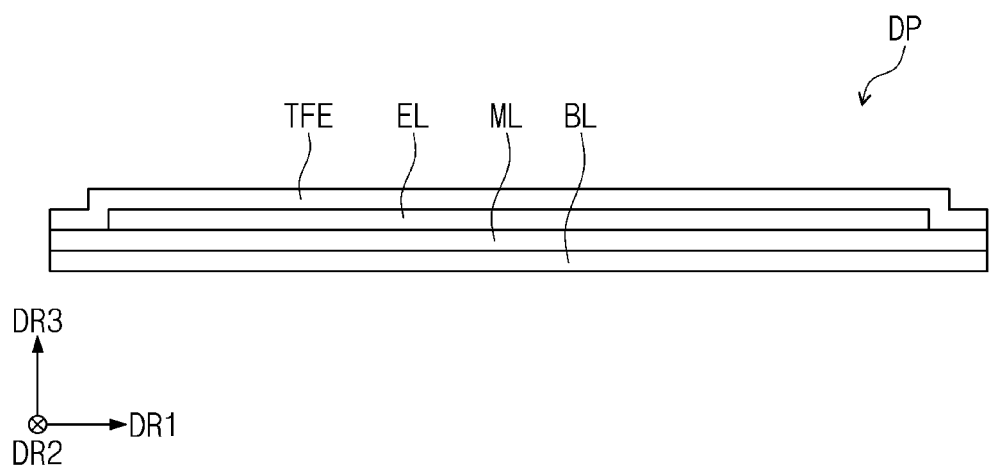
FIG. 5 is a cross-sectional view illustrating a display panel according to an exemplary embodiment of the inventive concepts.

FIG. 5 is a cross-sectional view illustrating a display panel according to an exemplary embodiment of the present invention.

Referring to FIG. 5, a display panel DP may include a base layer BL, a circuit layer ML, a light emitting element layer EL, and a thin-film encapsulation layer TFE.

The base layer BL may include a flexible material. For example, the base layer BL may be a plastic substrate. The plastic substrate may include at least one of an acrylic-based resin, a methacryl-based resin, polyisoprene, a vinyl-based resin, an epoxy-based resin, an urethane-based resin, a cellulose-based resin, a siloxane-based resin, a polyimide-based resin, a polyamide-based resin, and a perylene-based resin. For example, the base layer BL may include a single layer of a polyimide-based resin. However, the inventive concepts are not limited thereto. For example, the base layer BL may be a laminated structure having a plurality of insulation layers.

The circuit layer ML may be disposed on the base layer BL. The circuit layer ML may include a plurality of insulation layers, a plurality of conductive layers, and a semiconductor layer.

The light emitting element layer EL may be disposed on the circuit layer ML. The light emitting element layer EL may include, e.g., organic light emitting diodes.

The thin-film encapsulation layer TFE may seal the light emitting element layer EL. The thin-film encapsulation layer TFE may include a plurality of inorganic layers and at least one organic layer disposed therebetween.

Figure 6:
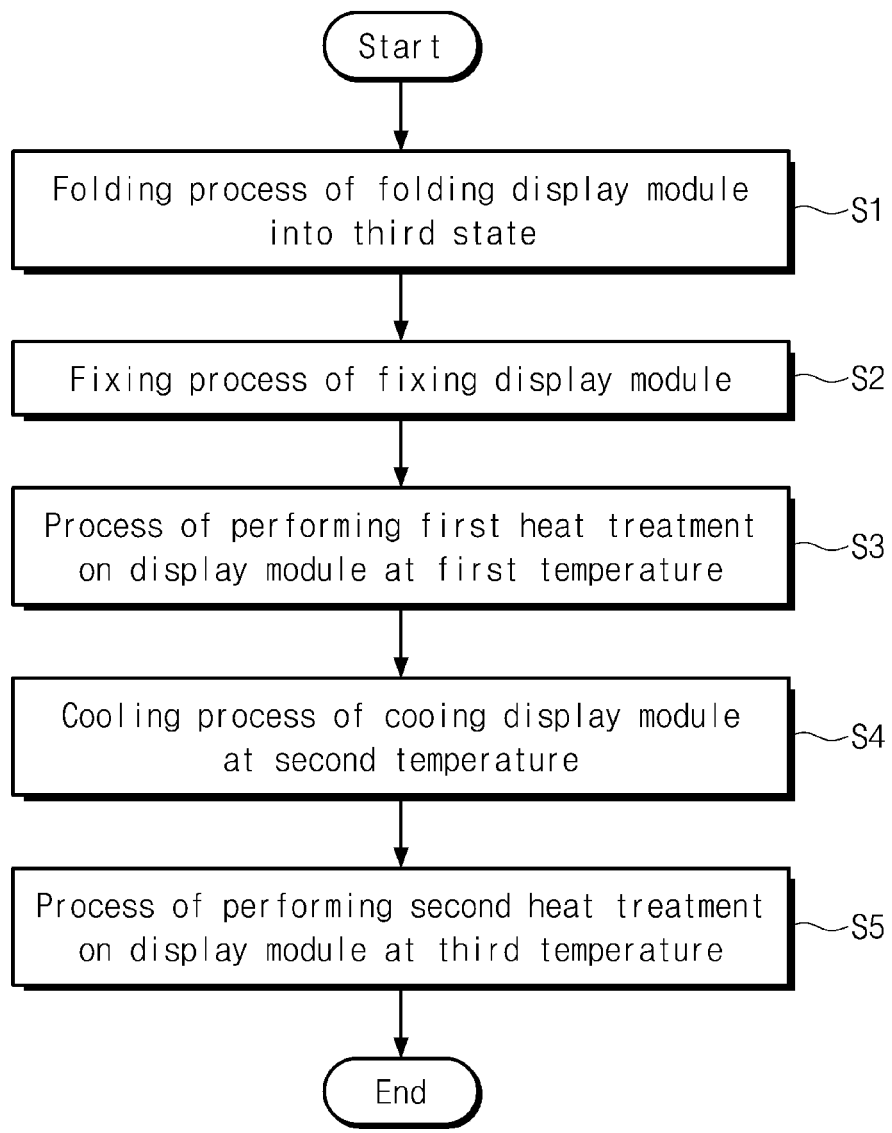
FIG. 6 is a flowchart showing a method for manufacturing the display module according to an exemplary embodiment of the inventive concepts.
Figure 7:
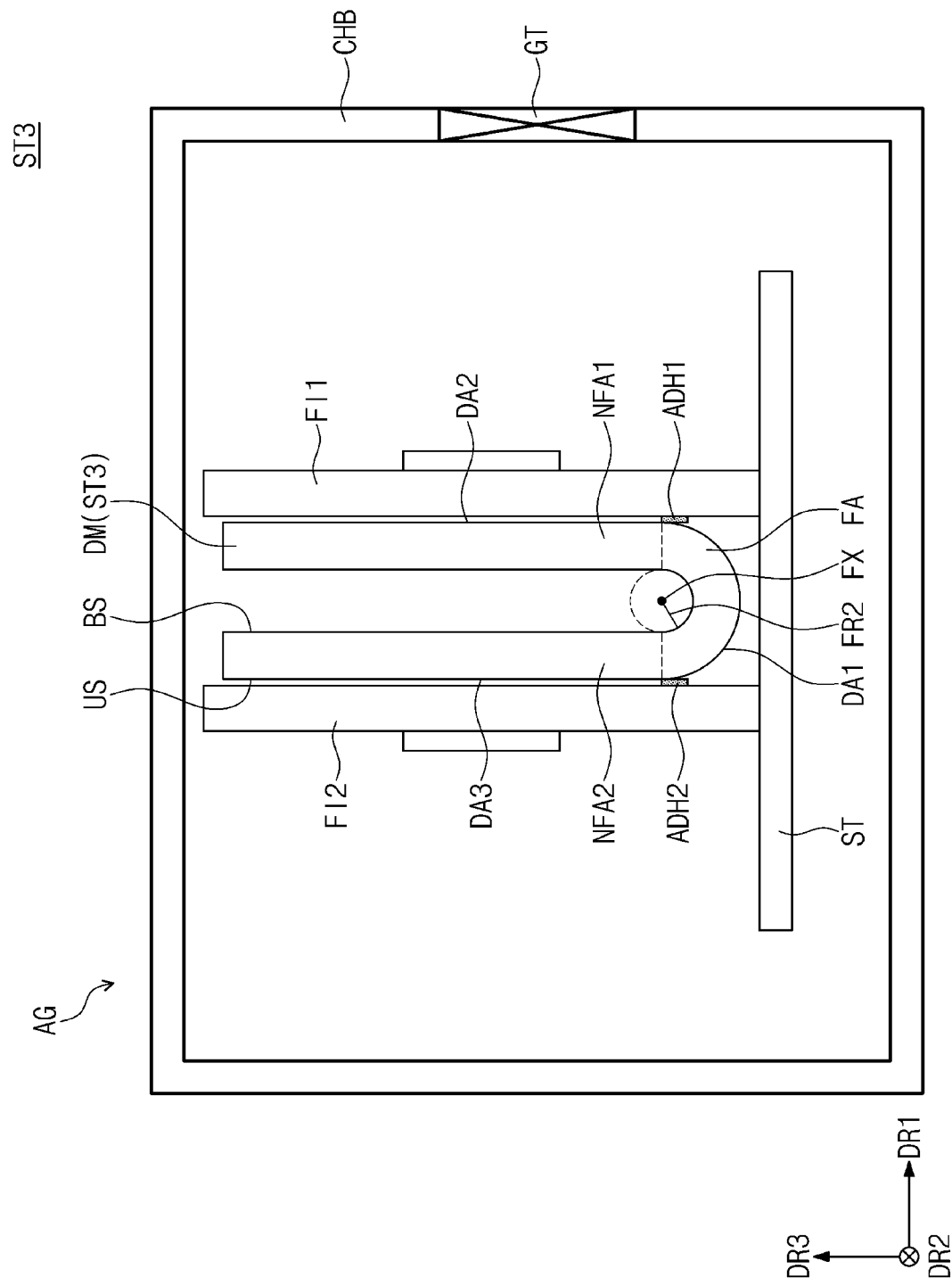
FIG. 7 is a perspective view illustrating an aging device according to an exemplary embodiment of the inventive concepts.

FIG. 6 is a flowchart showing a method for manufacturing a display module according to an exemplary embodiment of the present invention, and FIG. 7 is a perspective view illustrating an aging device according to an exemplary embodiment of the present invention.

Referring to FIGS. 6 and 7, an aging device AG may include a chamber CHB, a gate GT, a stage ST, a first fixing part FI1, a second fixing part FI2, a first adhesive part ADH1, and a second adhesive part ADH2.

The stage ST, the first fixing part FI1, the second fixing part FI2, the first adhesive part ADH2, and the second adhesive part ADH2 may be disposed in the chamber CHB.

The chamber CHB may provide a closed space. The chamber CHB may include at least one gate GT. The chamber CHB may be opened and closed through the gate GT. The display module DM may be introduced and withdrawn through the gate GT of the chamber CHB.

The stage ST may be disposed at a lower portion in the chamber CHB. The first fixing part FI1 and the second fixing part FI2 may be disposed on the stage ST. The second fixing part FI2 may be spaced apart from the first fixing part FI1 while facing the first fixing part FI1.

The display module DM may be disposed between the first fixing part FI1 and the second fixing part FI2. The first adhesive part ADH1 may be disposed between the first fixing part FI1 and the display module DM. The second adhesive part ADH2 may be disposed between the second fixing part FI2 and the display module DM.

A process S1 of folding the display module DM into a third state ST3 may fold the display module DM with respect to the folding axis FX. The display module DM may be folded into the third state ST3 that is different from the second state (refer to FIG. 2).

The display module DM in the third state ST3 may be folded so that the second display surface DA2 and the third display surface DA3 face the outside. The third state ST3 may be a state that is folded in a reverse direction of the second state ST2 (refer to FIG. 2).

When the display module DM is in the third state ST3, the folding area FA2 of the display module DM may have a second radius of curvature FR2. The second radius of curvature FR2 may be equal to or less than the first radius of curvature FR1 (refer to FIG. 3).

A process S2 of fixing the display module DM may include an arrangement process, a first fixing process, and a second fixing process.

The arrangement process provides the display module DM in the third state ST3 between the first fixing part FI1 and the second fixing part FI2. Each of the first fixing part FI1 and the second fixing part FI2 may face a top surface US of the display module DM. Each of the first fixing part FI1 and the second fixing part FI2 may be transparent. Thus, the transparent first fixing part FI1 and the transparent second fixing part FI2 may allow the display module DM having the second radius of curvature FR2 to be easily disposed between the first fixing part FI1 and the second fixing part FI2.

The first fixing process may fix the first fixing part FI1 and the display module DM by using a first adhesive part ADH1. The first adhesive part ADH1 may be disposed between the first fixing part FI1 and the display module DM. For example, the first adhesive part ADH1 may be attached to the first display surface DA1 of the display module DM. However, the inventive concepts are not limited thereto. In an exemplary embodiment of the present invention, the first adhesive part ADH1 may be attached to the first display surface DA1 and the second display surface DA2.

The second fixing process may fix the second fixing part FI2 and the display module DM by using the second adhesive part ADH2. The second adhesive part ADH2 may be disposed between the second fixing part FI2 and the display module DM. For example, the second adhesive part ADH2 may be attached to the first display surface DA1 of the display module DM. However, the inventive concepts are not limited thereto. In an exemplary embodiment of the present invention, the second adhesive part ADH2 may be attached to the first display surface DA1 and the third display surface DA3.

After the fixing of the display module DM is performed, a process of aging the display module DM may be performed. The process of aging may include a first heat treatment process S3, a cooling process S4, and a second heat treatment process S5.

In the first heat treatment process S3, the display module DM may be heat-treated at a first temperature. In the first heat treatment process S3, the display module DM may be in the third state ST3. Here, the first temperature may be equal to or greater than about 50° C. and equal to or less than about 100° C. The first heat treatment process S3 may be performed for a time period of about 30 minutes or more and about 60 minutes or less.

The display module DM may generate largest deformation at the first temperature. Thus, the display module may be deformed in the first heat treatment process S3. In the first heat treatment process S3, the display module DM may be thermally tempered. Due to the thermal tempering, the display module DM may increase in yield strength.

According to an exemplary embodiment of the present invention, the yield strength of the display module DM may increase as a result of the first heat treatment process S3. The display module DM, which increases in yield strength, may have a tolerance to a stress generated when folded from the first state ST1 (refer to FIG. 1) to the second state ST2 (refer to FIG. 2). The display module, which has a strong tolerance to a stress, may be prevented from being degraded in display quality. Thus, the display module DM having improved reliability may be provided.

In the cooling process S4, the display module DM may be cooled at a second temperature. In the cooling process S4, the display module DM may be in the third state ST3. The second temperature may be equal to or less than about −20° C. The cooling process S4 may be performed during about 10 minutes or more and about 15 minutes or less. In an exemplary embodiment of the present invention, the cooling process S4 may be omitted.

The display module DM may be deformed in the first heat treatment process S3 and then contracted at the second temperature. Thus, the cooling process S4 may thermally temper the display module DM. Due to the thermal tempering, the display module DM may increase in yield strength.

The second heat treatment process S5 may heat-treat the display module DM at a third temperature. In the second heat treatment process S5, the display module DM may be in the third state ST3. The third temperature may be less than the first temperature and greater than the second temperature. The third temperature may be greater than the room temperature. The third temperature may be equal to or greater than about 20° C. and equal to or less than about 50° C.

The display module DM in a low temperature state may be unfolded from the third state ST3 to the first state ST1 (refer to FIG. 1). In this case, a delamination or a crack may be generated in the inorganic layer of the thin-film encapsulation layer TFE (refer to FIG. 5). However, according to an exemplary embodiment of the present invention, the second heat treatment process S5 may be additionally performed on the display module DM in the low temperature state. In this case, the delamination or the crack generated in the inorganic layer of the thin-film encapsulation layer TFE (refer to FIG. 5), which may be generated when the display module DM is unfolded from the third state ST3 to the first state ST1 (refer to FIG. 1), may be prevented. In an exemplary embodiment of the present invention, when the cooling process S4 is omitted, the second heat treatment process S5 may be omitted.

Figure 8:
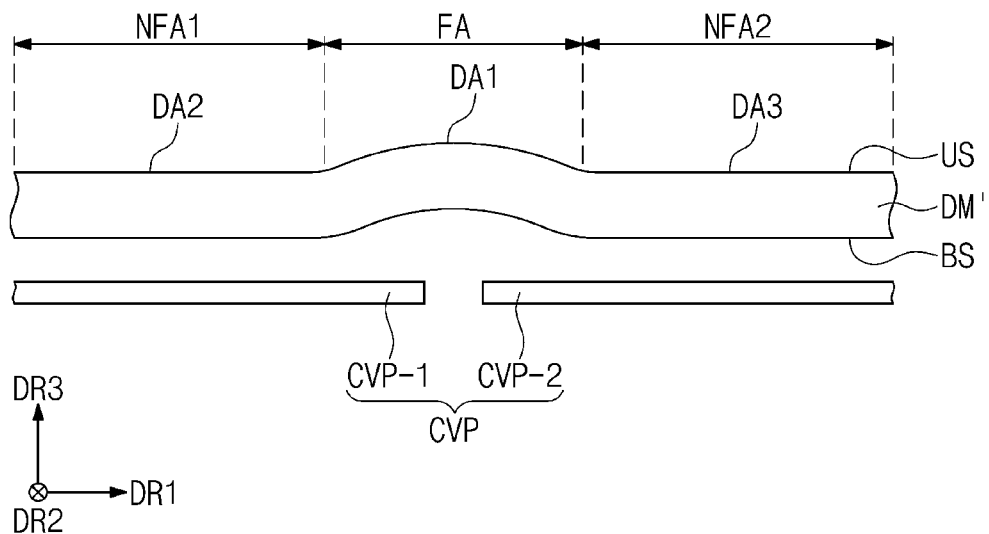
FIG. 8 is a cross-sectional view illustrating a portion of a display device according to an exemplary embodiment of the inventive concepts.

FIG. 8 is a cross-sectional view illustrating a portion of a display device according to an exemplary embodiment of the present invention.

Referring to FIG. 8, a display module DM' is manufactured in a manufacturing method in FIG. 6. The display module DM', which has undergone the first heat treatment process S3, may be deformed in the shape of the folding area FA. The folding area FA of the display module DM' may protrude in the third direction DR3.

The cover member CVP may include a metal plate or a plastic plate. For example, the cover member CVP may include stainless steel, aluminum, or an alloy thereof. The cover member CVP may have a strength greater than that of the display module DM'.

The cover member CVP may include a first cover member CVP-1 and a second cover member CVP-2. The first cover member CVP-1 and the second cover member CVP-2 may be separated from each other with respect to the folding axis FX (refer to FIG. 1). In an exemplary embodiment of the present invention, when two folding axes FX (refer to FIG. 1) are provided, the cover member CVP may include first to third cover members.

On a plane, the first cover member CVP-1 may overlap the first non-folding area NFA1. On the plane, the second cover member CVP-2 may overlap the second non-folding area NFA2.

Figure 9:
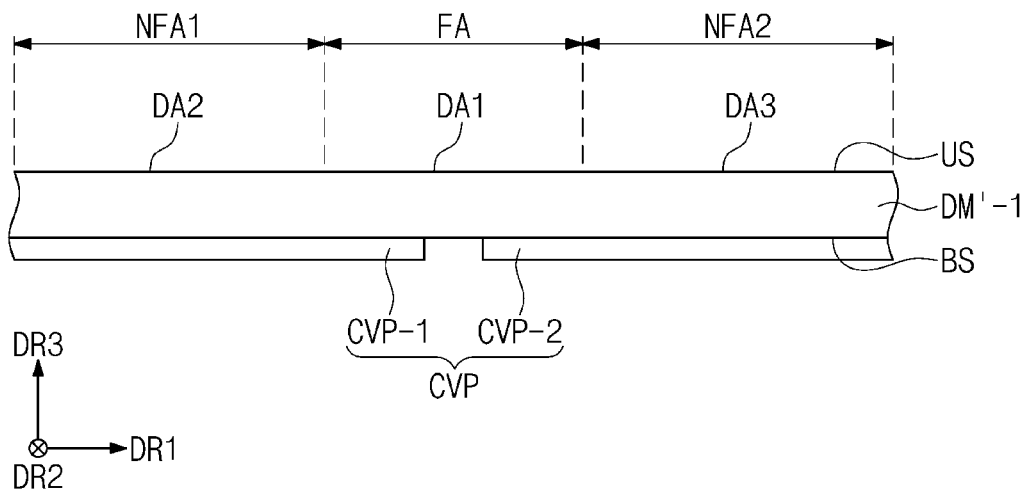
FIG. 9 is a cross-sectional view illustrating a portion of a display device according to an exemplary embodiment of the inventive concepts.

FIG. 9 is a cross-sectional view illustrating a portion of a display device according to an exemplary embodiment of the present invention. The components described in FIG. 8 will be designated by the same reference numerals, and description regarding this will be omitted.

Referring to FIGS. 8 and 9, FIG. 9 is a view illustrating a portion of the display device DD (refer to FIG. 1) in which the display module DM' and the cover member CVP in FIG. 8 are coupled.

Before being coupled, the folding area FA of the display module DM' may be pulled to be a flat state, and then the display module DM' may be coupled with the cover member CVP to provide the display module DM'-1 disposed on the cover member CVP.

As the adhesive layer AL (refer to FIG. 3) is further disposed between the display module DM'-1 and the cover member CVP, the display module DM'-1 and the cover member CVP may be coupled to each other.

Since a foldable display device is able to be folded and unfolded, the display module DM'-1 may have an extremely thin film shape. In the foldable display device, a compressive stress and a tensile stress may be accumulated in the folding area FA when repetitively folded. The stresses accumulated in the folding area FA may still remain in the folding area FA in an accumulated state even when the foldable display device is unfolded to cause deformation. This may cause an appearance defect of the foldable display device to resultantly degrade a display quality of the display module. According to the exemplary embodiment of the present invention, the display module DM' may be deformed in a reverse direction of a folding direction of the display module DM' in the third state ST3 (refer to FIG. 7) by the first heat treatment process S3 (refer to FIG. 6). The folding area FA of the display module DM' may protrude in the third direction DR3. The display module DM'-1 may be pulled into a flat state and then coupled to the cover member CVP. Because the stress generated when the display module DM'-1 is folded into the second state ST2 (refer to FIG. 2) may be cancelled out by the stresses in the display module DM'-1, a stress applied to the folding area FA may be reduced. Thus, the display module DM'-1 having improved reliability may be provided.

According to the inventive concepts, the folding area of the display module may be thermally tempered by the process of the first heat treatment. In the process of the first heat treatment, the folding area of the display module may be deformed in the reverse direction of the folding direction of the display module. The display module may increase in yield strength by the process of the first heat treatment. The display module, which increases in yield strength, may have a strong tolerance to the stress generated when the display module is folded. The display module having the strong tolerance to the stress may be prevented from being degraded in display quality. Thus, the display module having the improved reliability may be provided.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method for manufacturing a display module that is variable from a first state, which is unfolded, to a second state, which is folded with respect to a folding axis, the method comprising:
    folding the display module into a third state that is different from the second state; and
    performing a first heat treatment on the display module in the third state at a first temperature,
    wherein:
    a folding area of the display module has a first radius of curvature in the second state;
    the folding area of the display module has a second radius of curvature in the third state; and
    the first radius of curvature is greater than the second radius of curvature.

2. The method of claim 1, wherein the first temperature is equal to or greater than about 50° C. and equal to or less than about 100° C.

3. The method of claim 1, wherein the performing of the first heat treatment occurs during a time period equal to or greater than about 30 minutes and equal to or less than about 60 minutes.

4. The method of claim 1, further comprising cooling the display module at a second temperature.

5. The method of claim 4, wherein the second temperature is equal to or less than about −20° C.

6. The method of claim 5, wherein the cooling of the display module at the second temperature is performed during a time period equal to or greater than about 10 minutes and equal to or less than about 15 minutes.

7. The method of claim 1, further comprising performing a second heat treatment on the display module at a third temperature.

8. The method of claim 7, wherein the third temperature is equal to or greater than about 20° C. and equal to or less than about 50° C.

9. The method of claim 1, further comprising fixing the display module,
wherein the fixing of the display module comprises:
an arrangement process of providing the display module in the third state between a first fixing part and a second fixing part that is spaced apart from the first fixing part while facing the same;
a first fixing process of fixing the first fixing part and the display module by using a first adhesive part; and
a second fixing process of fixing the second fixing part and the display module by using a second adhesive part.

10. The method of claim 9, wherein:
the display module comprises a first display surface folded with respect to the folding axis, and a second display surface and a third display surface, which are spaced apart from each other with the first display surface therebetween; and
each of the first adhesive part and the second adhesive part is attached to the first display surface.

11. The method of claim 9, wherein each of the first fixing part and the second fixing part is transparent.

12. The method of claim 1, wherein:
the display module comprises a first display surface folded with respect to the folding axis, and a second display surface and a third display surface, which are spaced apart from each other with the first display surface therebetween;
in the second state, the display module is folded so that each of the second display surface and the third display surface faces the inside; and
in the third state, the display module is folded so that each of the second display surface and the third display surface faces the outside.

13. A method for manufacturing a display device that is variable from a first state, which is unfolded, to a second state, which is folded with respect to a folding axis, the method comprising:
forming a display module; and
aging the display module that is folded into a third state different from the second state,
wherein:
a folding area of the display module has a first radius of curvature in the second state;
the folding area of the display module has a second radius of curvature in the third state; and
the first radius of curvature is greater than the second radius of curvature.

14. The method of claim 13, wherein the aging of the display module comprises:
performing a first heat treatment on the display module at a first temperature; and
performing a second heat treatment on the display module at a second temperature after the performing of the first heat treatment.

15. The method of claim 14, wherein:
the first temperature is equal to or greater than about 50° C. and equal to or less than about 100° C.; and
the second temperature is equal to or greater than about 20° C. and equal to or less than about 50° C.

16. The method of claim 14, wherein the performing of the first heat treatment occurs during a time period equal to or greater than about 30 minutes and equal to or less than about 60 minutes.

17. The method of claim 14, wherein the aging of the display module further comprises cooling the display module at a temperature equal to or less than about −20° C. between the performing of the first heat treatment and the performing of the second heat treatment.

18. The method of claim 13, wherein:
the display module comprises a first display surface folded with respect to the folding axis, and a second display surface and a third display surface, which are spaced apart from each other with the first display surface therebetween;
in the second state, the display module is folded so that each of the second display surface and the third display surface faces the inside; and
in the third state, the display module is folded so that each of the second display surface and the third display surface faces the outside.

* * * * *